(12) United States Patent
Taniyama et al.

(10) Patent No.: US 11,658,040 B2
(45) Date of Patent: May 23, 2023

(54) PLASMA PROCESSING METHOD

(71) Applicant: Hitachi High-Tech Corporation, Tokyo (JP)

(72) Inventors: Masaaki Taniyama, Tokyo (JP); Kenichi Kuwahara, Tokyo (JP); Satoshi Une, Tokyo (JP)

(73) Assignee: HITACHI HIGH-TECH CORPORATION, Tokyo (JP)

(*) Notice: Subject to any disclaimer, the term of this patent is extended or adjusted under 35 U.S.C. 154(b) by 0 days.

(21) Appl. No.: 16/957,878

(22) PCT Filed: Jun. 26, 2019

(86) PCT No.: PCT/JP2019/025449
§ 371 (c)(1),
(2) Date: Jun. 25, 2020

(87) PCT Pub. No.: WO2020/100339
PCT Pub. Date: May 22, 2020

(65) Prior Publication Data
US 2020/0411327 A1 Dec. 31, 2020

(51) Int. Cl.
*H01L 21/311* (2006.01)
*H01L 21/3065* (2006.01)
(Continued)

(52) U.S. Cl.
CPC .... *H01L 21/31144* (2013.01); *H01L 21/3065* (2013.01); *H01L 21/3086* (2013.01);
(Continued)

(58) Field of Classification Search
CPC .......... H01L 21/31144; H01L 21/3065; H01L 21/3086; H01L 21/31116; H01L 21/32137;
(Continued)

(56) References Cited

U.S. PATENT DOCUMENTS 6,248,252 B1 * 6/2001 Nguyen .................... C23F 4/00
216/58
8,501,626 B2 8/2013 Liu et al.
(Continued)

FOREIGN PATENT DOCUMENTS

JP H07235590 A 9/1995
JP 2007507091 A 3/2007
(Continued)

OTHER PUBLICATIONS

Office Action dated Nov. 13, 2020 in Taiwanese Application No. 109114146.
(Continued)

*Primary Examiner* — Shamim Ahmed
(74) *Attorney, Agent, or Firm* — Miles & Stockbridge, P.C.

(57) ABSTRACT

The invention provides a plasma processing method in which plasma etching is performed on a film to be etched by using a mask, the plasma processing method including: a deposition step of depositing a deposition film containing a boron element on the mask while a radio frequency power is supplied to a sample table on which a sample formed with the film to be etched is placed; and an etching step of etching the film to be etched by using plasma after the deposition step.

9 Claims, 8 Drawing Sheets

(51) Int. Cl.
*H01L 21/3213* (2006.01)
*H01L 21/308* (2006.01)

(52) U.S. Cl.
CPC .. *H01L 21/31116* (2013.01); *H01L 21/32137* (2013.01); *H01L 21/32139* (2013.01)

(58) Field of Classification Search
CPC ......... H01L 21/32139; H01L 21/02274; H01L 21/02112
See application file for complete search history.

(56) References Cited

U.S. PATENT DOCUMENTS

| | | | |
|---|---|---|---|
| 9,412,617 B2 | 8/2016 | Narishige et al. | |
| 2005/0042879 A1 | 2/2005 | Yin et al. | |
| 2008/0057729 A1* | 3/2008 | Shen | H01L 21/76802 438/735 |
| 2009/0004870 A1* | 1/2009 | Liu | H01L 21/32137 438/710 |
| 2009/0206053 A1 | 8/2009 | Shimizu et al. | |
| 2009/0286402 A1 | 11/2009 | Xia et al. | |
| 2011/0318931 A1* | 12/2011 | Min | H01L 21/31144 257/E21.214 |
| 2012/0208369 A1* | 8/2012 | Nishizuka | H01J 37/32192 438/724 |
| 2013/0344701 A1 | 12/2013 | Liu et al. | |
| 2015/0303069 A1 | 10/2015 | Narishige et al. | |
| 2016/0196982 A1* | 7/2016 | Kang | H01L 21/3086 438/702 |
| 2017/0207088 A1 | 7/2017 | Kwon et al. | |
| 2017/0316950 A1* | 11/2017 | Byun | H01L 21/0337 |
| 2018/0090319 A1 | 3/2018 | Miyahara et al. | |
| 2019/0096672 A1* | 3/2019 | Luong | H01L 21/31116 |
| 2020/0402808 A1* | 12/2020 | Tsai | H01L 21/31055 |

FOREIGN PATENT DOCUMENTS

| | | |
|---|---|---|
| JP | 2009200080 A | 9/2009 |
| JP | 2011521452 A | 7/2011 |
| JP | 2012227440 A | 11/2012 |
| JP | 2018056345 A | 4/2018 |
| JP | 2019503082 A | 1/2019 |
| KR | 10-2008-0114626 A | 12/2008 |
| KR | 10-2011-0016916 A | 2/2011 |
| KR | 10-2015-0035583 A | 4/2015 |

OTHER PUBLICATIONS

Search Report dated Aug. 27, 2019 in corresponding International Application No. PCT/JP2019/025449.
Office Action dated Aug. 27, 2021 in Korean Application No. 10-2020-7009885.

* cited by examiner

PLASMA PROCESSING METHOD

TECHNICAL FIELD

The present invention relates to a plasma processing technique, for example, to an effective technique applied to a technique of etching a film to be etched after forming a protective film on a side wall of a mask pattern.

BACKGROUND ART

JP-A-2009-200080 (PTL 1) discloses an etching technique in which a side wall is protected by etching with a mixed gas including a gas containing oxygen and a gas containing sulfur and no oxygen to obtain a desired dimension and a desired shape.

JP-A-2018-56345 (PTL 2) discloses a technique in which a hard mask having a boron-based film is used as an etching mask when a film including a silicon oxide film formed on a substrate to be processed is dry-etched.

CITATION LIST

Patent Literature

PTL 1: JP-A-2009-200080
PTL 2: JP-A-2018-56345

SUMMARY OF INVENTION

Technical Problem

In recent years, as miniaturization of semiconductor devices is progressed, higher densification of a processing technique is required. Under such circumstances, in a next-generation lithography technique represented by an extreme ultraviolet exposure technology (EUV technique), a thin film of a resist film forming a mask pattern is progressing with miniaturization of the mask pattern. As a result, a reduction in an etching selection ratio between the mask pattern and the film to be etched, and a limitation in reducing a hole diameter of a hole pattern and the like due to a limitation of the lithography technique are apparent.

In order to solve the above-mentioned problem, a technique is proposed, in which a protective film is formed on the mask pattern, and the film to be etched is etched by using the mask pattern and the protective film as a mask. According to this technique, an advantage is obtained that as a result of forming the protective film on the mask pattern, the film to be etched can be processed with processing accuracy finer than dimensional accuracy of the mask pattern.

However, in the technique of forming the protective film on the mask pattern, the protective film functions as a part of the etching mask. For this reason, for example, when the film to be etched is processed by the plasma etching technique, the protective film forming a part of the etching mask is required to have resistance to the plasma. However, when a material used for the protective film is not sufficiently resistant to the plasma, controllability of processing dimensions for the film to be etched is reduced. Therefore, from a viewpoint of improving the controllability of the processing dimensions of the film to be etched, the protective film formed on the mask pattern is required to have improved resistance to the plasma. The invention provides a technique for improving the controllability of the processing dimensions for the film to be etched by forming a protective film containing boron with high resistance to the plasma on a side wall of the mask pattern.

Solution to Problem

A plasma processing method according to one embodiment is a plasma processing method in which plasma etching is performed on a film to be etched by using a mask, the plasma processing method including: a deposition step of depositing a deposition film containing a boron element on the mask while a radio frequency power is supplied to a sample table on which a sample formed with the film to be etched is placed; and an etching step of etching the film to be etched by using plasma after the deposition step.

Advantageous Effect

According to the plasma processing method of one embodiment, processing dimensional accuracy can be improved.

DESCRIPTION OF EMBODIMENTS

In all the drawings for illustrating the embodiment, the same members are denoted by the same reference numerals in principle, and the repetitive description thereof will be omitted. To make a drawing easy to understand, hatching is sometimes applied to the drawing even if the drawing is a plan view.

<Plasma Etching Apparatus>

Figure 1:
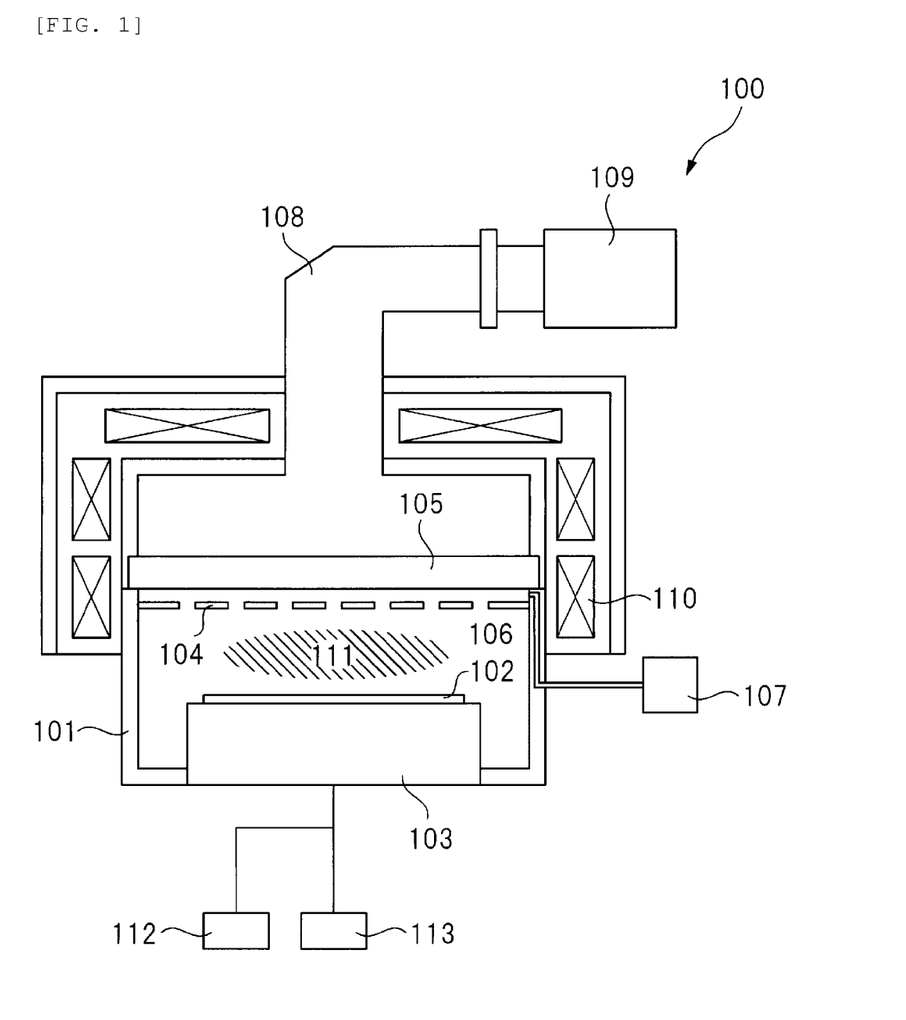
FIG. 1 is a diagram showing a configuration of a plasma etching apparatus according to an embodiment.

FIG. 1 is a diagram showing a schematic configuration of a plasma etching apparatus according to a present embodiment.

In FIG. 1, a plasma etching apparatus 100 according to the present embodiment is, for example, a microwave electron cyclotron resonance (ECR) discharge etching apparatus.

The plasma etching apparatus 100 according to the present embodiment includes a chamber 101, a stage (sample table) 103 which is a wafer placing electrode on which a substrate to be processed 102 is placed, a shower plate 104 provided on an upper surface of the chamber and for introducing an etching gas, and a dielectric window 105 that transmits a microwave. In the plasma etching apparatus 100 according to the present embodiment, a processing chamber 106 is formed in the chamber 101 by sealing the stage 103, the shower plate 104, and the dielectric window 105 which are described above. An inside of the processing chamber 106 can be brought into a high vacuum state.

The substrate to be processed 102 includes, for example, a silicon substrate, a film to be etched that is formed on the silicon substrate, and a mask pattern formed on the film to be etched. The silicon substrate is, for example, a semiconductor substrate that has a planar and substantially circular shape and is called a wafer. The film to be etched is formed of, for example, a laminated film of a polysilicon film and a silicon oxide film formed on the polysilicon film. Further, the mask pattern is formed of, for example, a resist film patterned by a lithography technique.

A gas supply device 107 for supplying the etching gas to the processing chamber 106 is connected to the shower plate 104. Further, in order to transmit power for generating plasma to the processing chamber 106, a waveguide 108 for emitting an electromagnetic wave which is a radio frequency for plasma generation is provided above the dielectric window 105. The electromagnetic wave transmitted to the waveguide 108 oscillates from an electromagnetic wave generation power supply 109. At this time, frequency of the electromagnetic wave is not particularly limited, and for example, a microwave of 2.45 GHz can be used.

Then, a magnetic field generation coil 110 for generating a magnetic field is provided on an outer peripheral portion of the processing chamber 106, and power oscillated from the electromagnetic wave generation power supply 109 interacts with the magnetic field generated by the magnetic field generation coil 110, such that high-density plasma 111 is generated in the processing chamber 106. Note that a surface of the stage 103 is covered with a thermal spray film (not shown).

The substrate to be processed 102 carried into the processing chamber 106 is sucked onto the stage 103 by an electrostatic force caused by a DC voltage applied from a DC power supply 112, and a temperature thereof is adjusted.

After a desired etching gas is supplied into the processing chamber 106 by the gas supply device 107, a pressure in the processing chamber 106 is set to a predetermined pressure. Then, in this state, the plasma 111 is generated in the processing chamber 106. Here, by applying a radio frequency power for bias from a radio frequency power supply 113 connected to the stage 103, ions are drawn from the plasma 111 to the substrate to be processed 102, and plasma processing is performed on the substrate to be processed 102.

As the plasma etching apparatus according to the present embodiment, for example, the microwave ECR discharge etching apparatus is described as an example, but the plasma etching apparatus according to the present embodiment is not limited to this, and can be configured, for example, with a helicon wave plasma etching apparatus, an inductively coupled plasma etching apparatus, a capacitively coupled plasma etching apparatus, or the like.

<New Findings Discovered by Present Inventor>

Next, a description will be given of findings newly found by a present inventor when performing a plasma etching method using the above-described plasma etching apparatus.

For example, the following plasma etching method is implemented by the above-described plasma etching apparatus. That is, firstly, a substrate having a film to be etched and a mask pattern formed on the film to be etched is carried into the plasma etching apparatus. Then, in this plasma etching apparatus, a protective film is formed on a side wall of the mask pattern. Thus, when a combination of the mask pattern and the protective film is used as a mask, a highly accurate mask pattern can be formed as compared with a case where the mask pattern is used alone. This is because, for example, attention is paid to an interval between a first pattern and a second pattern that constitute the mask pattern. In this case, when the protective film is formed on a side wall of the first pattern and the protective film is formed on a side wall of the second pattern, an interval between the protective film formed on the side wall of the first pattern and the protective film formed on the side wall of the second pattern is smaller than the interval between the first pattern and the second pattern. As a result, for example, a diameter of a hole pattern formed by processing the film to be etched exposed from the interval between the protective film formed on the side wall of the first pattern and the protective film formed on the side wall of the second pattern is smaller than a diameter of a hole pattern formed by processing the film to be etched with the first pattern and the second pattern as the masks. This means that a finer hole pattern can be formed by forming the protective film on the side wall of the mask pattern than the case where the mask pattern is used alone. Therefore, it can be seen that a finer hole pattern exceeding a limit of a single mask pattern can be formed by using the mask having the protective film formed on the side wall of the mask pattern. That is, by using a technique of forming the protective film on the side wall of the mask pattern, fine processing that is difficult to be implemented by the single mask pattern can be performed.

Here, the present inventor has studied the technique of forming the protective film on the side wall of the mask pattern, and as a result, the following new knowledge is obtained. Therefore, this point will be described.

For example, the protective film is formed on the side wall of the mask pattern, and the film to be etched is plasma-etched by using the combination of the mask pattern and the protective film as the mask. At this time, not only the mask pattern but also the protective film is exposed to a plasma atmosphere. Therefore, the protective film is required to have resistance to the plasma.

In this regard, for example, when the plasma etching is performed on the film to be etched by using a protective film having insufficient resistance to the plasma, as a result of the protective film being damaged by the plasma, for example, the protective film disappears, and the protective film does not function sufficiently as the mask. For this reason, when the protective film has low resistance to the plasma, it becomes difficult to ensure processing accuracy of the film to be etched. That is, even though the plasma etching is performed on the film to be etched by using the mask in which the protective film is formed on the side wall of the mask pattern, when the resistance of the protective film to plasma is low, a sufficient effect cannot be obtained even though the protective film is used for improving the processing accuracy of the film to be etched.

Therefore, as a result of studying for implementing the protective film having high plasma resistance, the present inventor finds that, by applying a film containing boron (B) as the protective film to the mask pattern, the resistance of the protective film to the plasma can be improved. That is, a finding discovered by the present inventor is that in order to implement fine processing of the film to be etched by the plasma etching in which the protective film is formed on the side wall of the mask pattern, the film containing the boron (B) is used as the protective film on the premise that it is important to improve the plasma resistance of the protective film. Then, the present inventor realizes the plasma etching method according to the present embodiment to be described below by applying this new finding to the plasma etching technique. Hereinafter, the plasma etching method according to the present embodiment will be described with reference to the drawings.

<Plasma Etching Method According to Embodiment>

Figure 2:
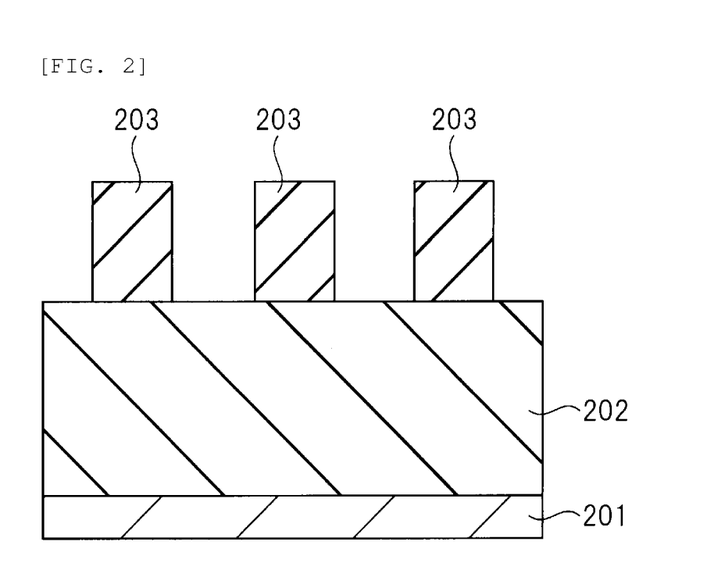
FIG. 2 is a cross-sectional view showing a plasma etching step according to the embodiment.

Firstly, FIG. 2 is a diagram showing a substrate as an object on which the plasma etching method according to the present embodiment is performed. As shown in FIG. 2, a substrate 201 in the present embodiment is, for example, the silicon substrate, and a film to be etched 202 is formed on the substrate 201. The film to be etched 202 is formed of, for example, the resist film, the polysilicon film, the silicon oxide film, or a silicon nitride film. On the film to be etched 202, for example, a resist pattern 203 is formed in a predetermined pattern. This resist pattern 203 is an example of the mask pattern in the present embodiment. The substrate 201 configured as described above is carried into, for example, the processing chamber 106 of the plasma etching apparatus 100 shown in FIG. 1, and is placed on the stage 103 provided in the processing chamber 106.

Figure 3:
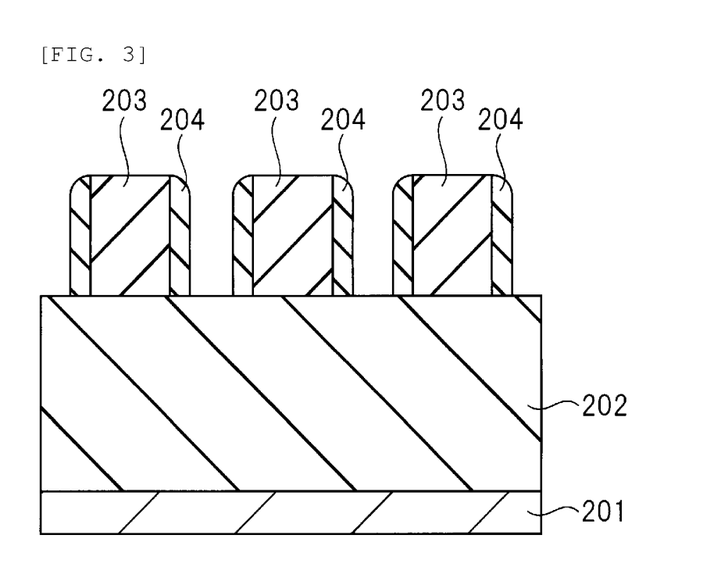
FIG. 3 is a cross-sectional view showing a plasma etching step according to the embodiment.

Next, a protective film 204 containing boron is formed on side walls of the resist pattern 203 on the substrate 201 placed on the stage 103. That is, in the present embodiment, as shown in FIG. 3, the protective films 204 containing the boron are formed on the side walls of the resist pattern 203 in the plasma etching apparatus for plasma-etching the film to be etched.

Specifically, a step of forming the protective film 204 in the plasma etching apparatus is performed by generating the plasma based on a mixed gas including a gas containing the boron and the etching gas in the processing chamber while a temperature of the substrate 201 is maintained between 10° C. or more and 100° C. or less. For example, the gas containing the boron is a deposition gas and is a source gas for the film containing the boron. On the other hand, in the present embodiment, the etching gas is introduced together with the gas containing the boron which is the deposition gas. At this time, the etching gas has a function of removing a deposition film. Therefore, a generation amount of deposits can be controlled by adjusting an addition ratio of the gas containing the boron which is the deposition gas to the etching gas. Here, as the deposition gas, a gas containing nitrogen may be added together with the gas containing the boron. In this case, the protective film also includes boron nitride. On the other hand, as the etching gas, for example, a gas containing fluorine or a gas containing chlorine can be used.

Further, at this time, an RF bias (radio frequency power) from the radio frequency power supply 113 connected to the stage 103 of the plasma etching apparatus 100 shown in FIG. 1 is applied to the substrate 201 (corresponding to the substrate to be processed 102 in FIG. 1). As a result, ions contained in the plasma are sputtered on the protective film 204 formed on a surface of the film to be etched 202, such that the protective film 204 formed on the film to be etched 202 is removed, and the protective films containing the boron can be selectively formed on the side walls of the resist pattern 203. However, when the RF bias is applied to the substrate 201, the resist pattern 203 is also damaged. For this reason, in order to remove the protective film 204 formed on the surface of the film to be etched 202 while reducing the damage to the resist pattern 203, it is desirable to adjust the RF bias applied to the substrate 201 so that incident energy of the ions is about 50 eV to 500 eV.

For example, the step of forming the protective film 204 in the present embodiment is performed under the following processing conditions. Specifically, as the processing conditions, a microwave power is set to 500 W, and the RF bias is applied at 30 W. Then, a mixed gas including a $BCl_3$ gas introduced into the processing chamber at 50 ml/min, a $N_2$ gas introduced into the processing chamber at 50 ml/min, a $CF_4$ gas introduced into the processing chamber at 50 ml/min and an Ar gas introduced into the processing chamber at 50 ml/min is used. As the processing condition, a condition in which the temperature of the substrate 201 (wafer) is maintained at 40° C. while an internal pressure of the processing chamber is maintained at 0.5 Pa is used. Thus, the protective film 204 formed of the film containing the boron can be formed on the side walls of the resist pattern 203.

Figure 4:
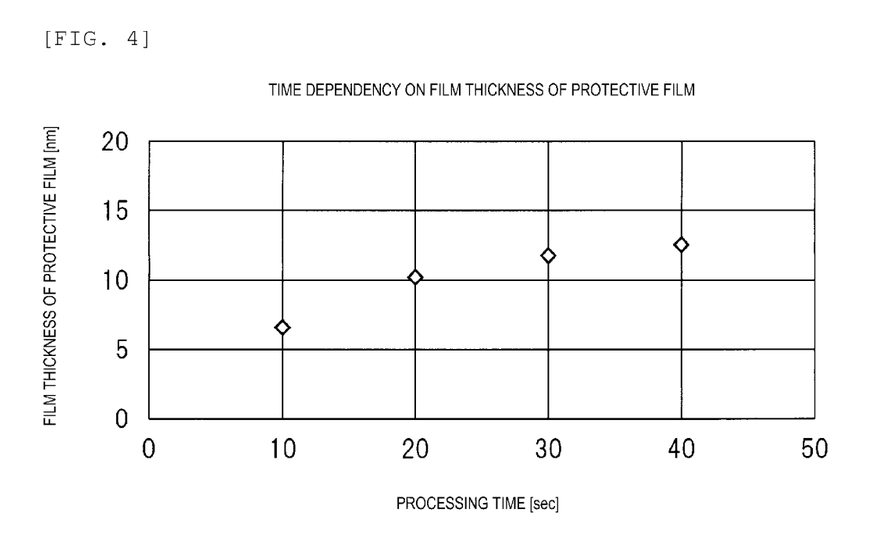
FIG. 4 is a diagram showing a relationship between a film thickness of a protective film formed on a side wall of a resist pattern and a plasma processing time.

Here, FIG. 4 is a diagram showing a relationship between a film thickness of the protective film 204 formed on the side walls of the resist pattern 203 and a plasma processing time in a case where, for example, a hole sample with a multilayer resist structure is used and the above processing conditions are applied. In FIG. 4, a horizontal axis indicates the processing time (sec), and a vertical axis indicates the film thickness (nm) of the protective film 204. As shown in FIG. 4, it can be seen that the film thickness of the protective film 204 changes depending on the processing time. Specifically, it is found that when the processing time is changed in a range of 10 seconds to 40 seconds, the film thickness of the protective film 204 changes from 6 nm to about 13 nm. That is, it is found that based on FIG. 4, as the processing time becomes longer, the film thickness of the protective film 204 increases. Therefore, in the step of forming the protective film 204 in the present embodiment, it can be seen that the film thickness of the protective film 204 can be adjusted by adjusting a time (processing time) during which the plasma is generated. That is, in the step of forming the protective film 204 in the present embodiment, by controlling the processing time based on the relationship in FIG. 4, the film thickness of the protective film 204 can be controlled, so that a desired hole diameter can be implemented.

Figure 5:
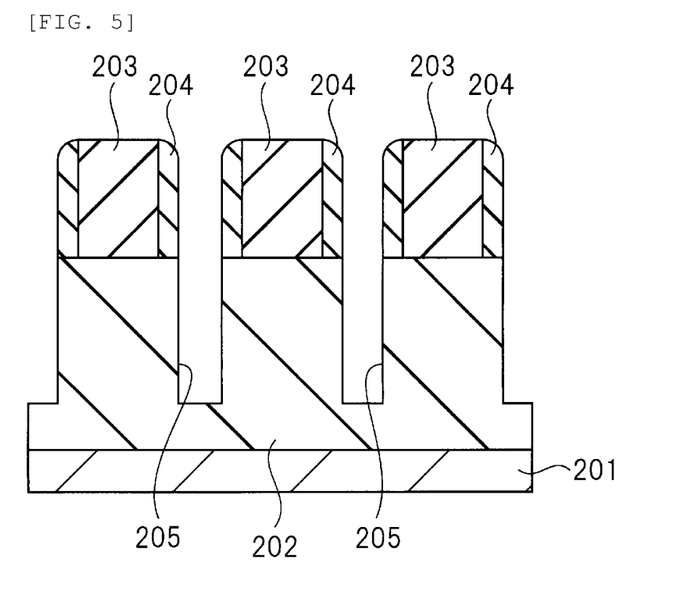
FIG. 5 is a cross-sectional view showing a plasma etching step according to the embodiment.

Subsequently, as shown in FIG. 5, the film to be etched 202 is etched by using the resist pattern 203 and the protective film 204 as the mask in the plasma etching apparatus. As a result, a hole pattern 205 aligning with the protective film 204 can be formed on the film to be etched 202.

For example, a step of forming the hole pattern 205 in the present embodiment is performed under the following processing conditions. Specifically, as the processing conditions, the microwave power is set to 900 W, and the RF bias is applied at 150 W. Then, a mixed gas including an $SO_2$ gas introduced into the processing chamber at 200 ml/min, an $O_2$ gas introduced into the processing chamber at 100 ml/min, and a He gas introduced into the processing chamber at 500 ml/min is used. As the processing condition, a condition in which the temperature of the substrate 201 (wafer) is maintained at 40° C. while the internal pressure of the processing chamber is maintained at 2.4 Pa is used. Thus, the film to be etched 202 is plasma-etched by using the resist pattern 203 and the protective film 204 as the mask, such that the hole pattern 205 can be formed.

Here, in the plasma etching method in the present embodiment, since the protective film 204 is formed of the film containing the boron, for example, the protective film 204 having higher resistance to plasma than that of the resist pattern 203 can be implemented. Further, the film containing the boron has higher resistance to plasma than any one of a carbon-containing film and a silicon-containing film. Therefore, according to the present embodiment, by using the film containing the boron as the protective film 204, fine processing accuracy of the hole diameter of the hole pattern 205 formed with the protective film 204 being used as the mask can be stable and implemented.

In implementing the plasma etching method in the present embodiment, a type of the processing apparatus (plasma etching apparatus) and the processing conditions are not particularly limited as long as a selection ratio between the film to be etched 202 and the mask formed by the combination of the resist pattern 203 and the protective film 204 can be ensured, and the desired hole diameter can be obtained. However, an effect of improving productivity can be obtained when, as in the present embodiment, a configuration in which the step of forming the protective film 204 and the step of plasma-etching the film to be etched 202 are continuously and collectively processed in one plasma etching apparatus is adopt.

<Feature According to Embodiment>

Next, a feature point of the present embodiment will be described.

The feature point of the present embodiment is that, in the plasma etching apparatus that performs the plasma etching on the film to be etched formed on the substrate, before the plasma etching is performed on the film to be etched, the protective film containing the boron is formed on the side wall of the resist pattern formed on the film to be etched. That is, the feature point of the present embodiment is that the protective film containing the boron is formed in the plasma etching apparatus having a plasma-etching function.

Thereby, the protective film containing the boron formed on the side wall of the resist pattern can be formed by the plasma processing, so that the protective film can be formed while maintaining the temperature of the substrate between 10° C. or more and 100° C. or less.

For example, PTL 2 described in "Background Art" describes a technique related to the hard mask having a boron-based film. Then, PTL 2 discloses that, for example, the hard mask having the boron-based film is formed by using a CVD apparatus. In this regard, paragraph [0026] of PTL 2 discloses that a temperature at which a boron film is formed by a CVD method is preferably in a range of 200° C. to 500° C.

In this regard, since heat resistance temperature of the hard mask is high, the boron-based film can be formed by the CVD method at the temperature range of 200° C. to 500° C., but on the premise that a resist pattern is presented instead of the hard mask, a heat resistance temperature of the resist film constituting a general resist pattern is about 100° C. to 200° C. For this reason, it is difficult to form the protective film containing the boron on the side wall of the resist pattern by using the technique described in PTL 2.

This is because a temperature at which the boron-based film is formed in the technique described in PTL 2 becomes higher than the heat resistance temperature of the resist film constituting the resist pattern. Therefore, for example, when the film containing the boron is formed on the resist pattern by using the CVD method described in PTL 2, due to thermal decomposition of the resist pattern or formation of a cured layer on the resist pattern, it is difficult to form the film containing the boron on the resist pattern while initial dimensions of the resist pattern are maintained.

On the other hand, according to the feature point of the present embodiment, since the protective film containing the boron is formed on the side wall of the resist pattern by using the plasma processing in the plasma etching apparatus instead of the CVD apparatus, the temperature of the substrate can be lower than the heat resistant temperature of the resist pattern. That is, according to the feature point of the present embodiment, the protective film containing the boron can be formed on the side wall of the resist pattern while the temperature of the substrate is maintained at a temperature lower than the heat resistance temperature of the resist pattern. For this reason, when the feature point of the present embodiment is adopted, the protective film containing the boron can be used not only in the hard mask but also in the mask made of the resist pattern. That is, according to the feature point of the present embodiment, regardless of a type of the mask, the protective film containing the boron can be formed on the side wall of the mask pattern over a wide variety of masks without changing a mask material. As described above, the feature point of the present embodiment is that a highly versatile technical idea can be provided regardless of the type of the mask.

For example, a hard mask has a higher etching selection ratio with the film to be etched than the mask made of the resist pattern, so that the hard mask is used when a hole pattern having a high aspect ratio or the like is formed, for example, while the mask made of the resist pattern is used for a patterning technique for general fine processing. For this reason, it can be said that a usage of the mask made of the resist pattern is greater than a usage of the hard mask.

Further, in a step of etching the film to be etched by using the hard mask, firstly, the resist pattern is formed, and then the hard mask is formed by using the resist pattern. Thereafter, the film to be etched is etched by using this hard mask. Therefore, in the step of etching the film to be etched by using the hard mask, a step of forming the resist pattern, a step of forming the hard mask, and a step of etching the film to be etched are required. On the other hand, in a step of etching the film to be etched by using the resist pattern, the resist pattern is formed, and then the film to be etched may be etched by using the resist pattern as the mask. That is, the step of etching the film to be etched by using the resist pattern only requires the step of forming the resist pattern and the step of etching the film to be etched. For this reason, the number of steps for etching the film to be etched by using the resist pattern can be reduced as compared with the number of steps for etching the film to be etched by using the hard mask.

From the above, as compared to the technique described in PTL 2 which is applicable only to the hard mask, it can be said that the plasma etching method according to the present embodiment, which can be applied not only to the hard mask but also to the resist pattern, has an excellent advantage in that it can be applied to highly versatile resist patterns.

Furthermore, the present embodiment is excellent in that the protective film containing the boron is formed on the side wall of the resist pattern by using the plasma etching apparatus that is usually used only for etching the film to be etched. In particular, the plasma etching apparatus has an advantage in that it can be adjusted so that the protective film containing the boron can be selectively formed on the side wall of the resist pattern by using the mixed gas including the deposition gas and the etching gas.

For example, at the time of forming the protective film containing the boron on the side wall of the mask pattern, for example, when the CVD apparatus is used, firstly, the protective film is formed so as to cover the mask pattern, and thereafter, it is necessary to leave the protective film only on the side wall of the mask pattern by performing anisotropic etching. On the other hand, in the plasma etching apparatus, by adjusting the ratio of the deposition gas to the etching gas and the incident energy of the ions obtained from the plasma, the protective film containing the boron can be formed only on the side wall of the mask pattern. This means that the step of forming the protective film containing the boron on the side wall of the mask pattern by using the plasma etching apparatus can be simplified as compared with the step of forming the protective film containing the boron on the side wall of the mask pattern by using the CVD apparatus.

Then, in a configuration in which the protective film containing the boron is formed on the side wall of the mask pattern by using the plasma etching apparatus, after the protective film containing the boron is formed on the side wall of the mask pattern, the plasma etching of the film to be etched can be continuously performed by using the mask pattern and the protective film as the mask without opening the processing chamber. In particular, when the protective film containing the boron is exposed to the atmosphere, the protective film may react with oxygen or moisture in the atmosphere and deteriorate. In this regard, according to the present embodiment, as described above, in the processing chamber of one plasma etching apparatus, the step of forming the protective film containing the boron on the side wall of the mask pattern and the step of performing plasma etching on the film to be etched by using the mask pattern and the protective film as the mask are performed continuously without opening the processing chamber to the atmosphere. For this reason, according to the present embodiment, it is a useful technical idea that the plasma etching can be performed on the film to be etched in a state where quality of the protective film having high resistance to the plasma is maintained.

<Further Devised Point>

In the above-described plasma etching method according to the present embodiment, in the plasma generated by the mixed gas including the deposition gas with the gas containing the boron and the etching gas, by adjusting the ratio of the deposition gas to the etching gas and the incident energy of the ions obtained from the plasma, the protective film containing the boron is formed only on the side wall of the mask pattern. In this regard, for example, when the mask pattern has a region with a high pattern density and a region with a low pattern density and a density difference between the pattern densities is large, in the region with the high pattern density, the protective film containing the boron is formed only on the side wall of the mask pattern, and meanwhile, in the region with the low pattern density, the protective film is formed not only on the side wall of the mask pattern but also on the surface of the film to be etched. This is because a surface area in the region with the low pattern density is relatively smaller than a surface area in the region with the high pattern density, and therefore, a film thickness of the deposition film per unit surface area in the region with the low pattern density is larger than a film thickness of the deposited film per unit surface area in the region with the high pattern density.

Therefore, in the plasma etching method according to the present embodiment, when the mask pattern has the region with the high pattern density and the region with the low pattern density and the density difference between the pattern densities is large, the protective film containing the boron may remain on the film to be etched without being completely removed in the region with the low pattern density. In this case, in the region with the low pattern density, there is a possibility that the plasma etching cannot be performed on the film to be etched due to the protective film containing the boron remaining on the film to be etched.

Therefore, in the present embodiment, a further devised point is implemented in a case where the mask pattern has the region with the high pattern density and the region with the low pattern density and the density difference between the pattern densities is large. Hereinafter, this devised point will be described.

Figure 6:
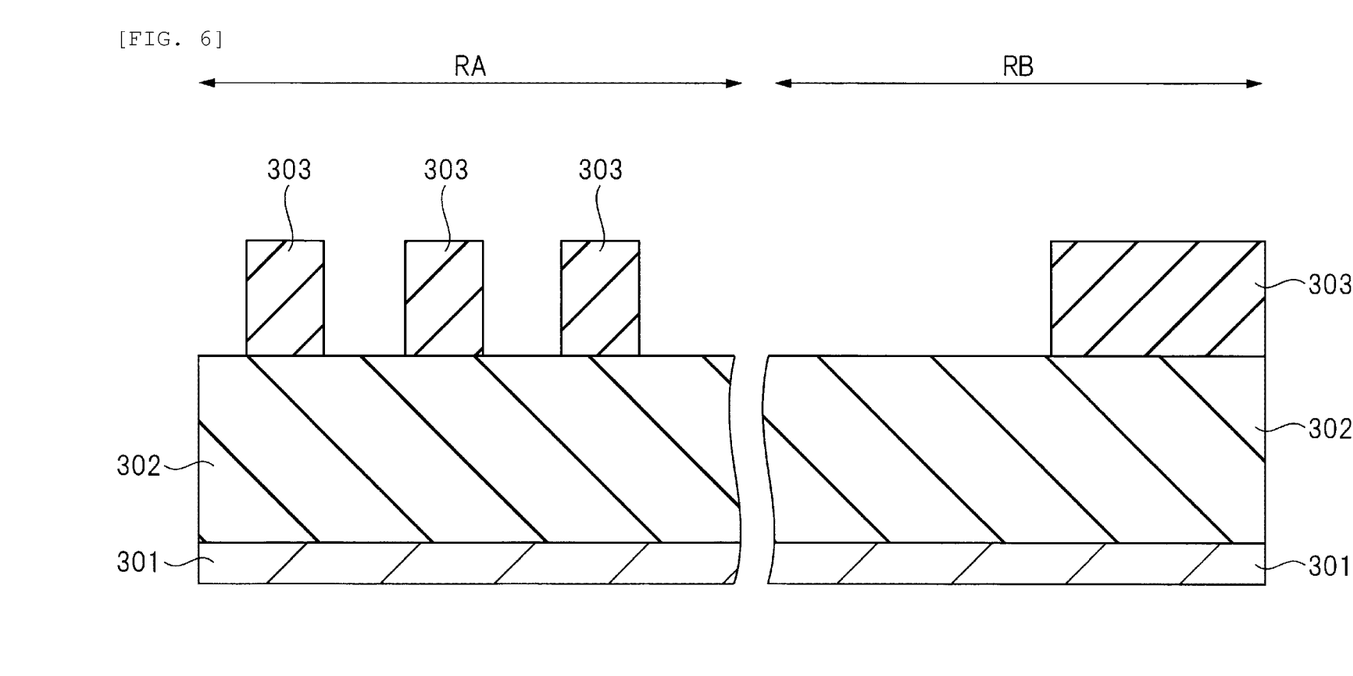
FIG. 6 is a cross-sectional view showing a plasma etching step according to the embodiment.

FIG. 6 schematically shows a substrate having the film to be etched and the resist pattern formed on the film to be etched, in which the resist pattern on the substrate includes a region with a high pattern density and a region with a low pattern density.

Here, as shown in FIG. 6, a film to be etched 302 is formed on a substrate 301, and a resist pattern 303 is formed on the film to be etched 302. At this time, as shown in FIG. 6, in a region RA, a pattern density of the resist pattern 303 formed on the film to be etched 302 is high. On the other hand, in a region RB, a pattern density of the resist pattern 303 formed on the film to be etched 302 is low. That is, the resist pattern 303 formed on the film to be etched 302 has a density difference in the pattern density. The substrate 301 configured as described above is carried into, for example, the processing chamber 106 of the plasma etching apparatus 100 shown in FIG. 1, and is placed on the stage 103 provided in the processing chamber 106.

Figure 7:
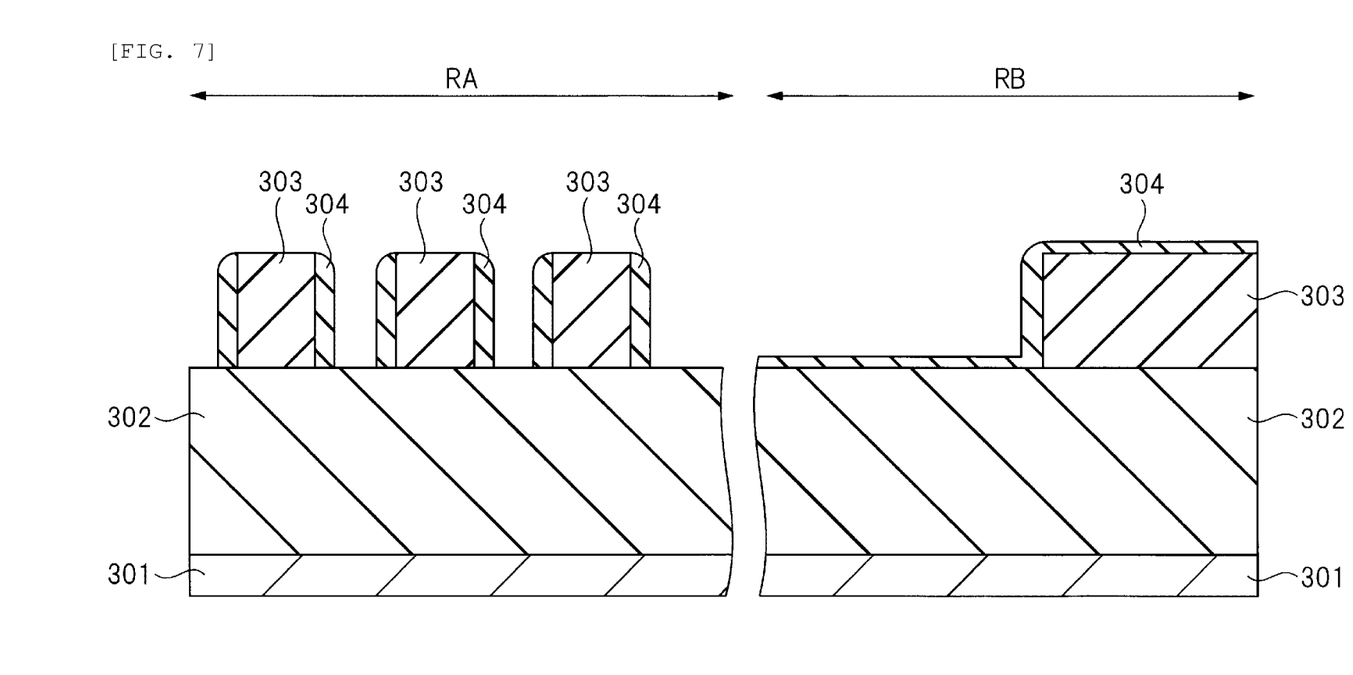
FIG. 7 is a cross-sectional view showing a plasma etching step according to the embodiment.

Next, as shown in FIG. 7, protective films 304 containing boron are formed on side walls of the resist patterns 303 on the substrate 301 placed on the stage 103. That is, in the present embodiment, the protective film 304 containing the boron is formed on the side wall of the resist pattern 303.

At this time, a step of forming the protective film 304 in the plasma etching apparatus is performed by generating the plasma based on the mixed gas including the gas (deposition gas) containing the boron and the etching gas in the processing chamber while maintaining a temperature of the substrate 301 between 10° C. or more and 100° C. or less. In the present embodiment, the addition ratio of the gas containing the boron which is the deposition gas to the etching gas is adjusted. Further, in the step of forming the protective film 304, for example, the RF bias (radio frequency power) from the radio frequency power supply 113 connected to the stage 103 of the plasma etching apparatus 100 shown in FIG. 1 is applied to the substrate 301 (corresponding to the substrate to be processed 102 in FIG. 1). Therefore, the incident energy of the ions obtained from the plasma is adjusted. In this way, the addition ratio of the gas containing the boron which is the deposition gas to the etching gas, and the incident energy of the ions obtained from the plasma are adjusted. As a result, as shown in FIG. 7, in the region RA, by sputtering ions contained in the plasma onto the protective film 304 formed on a surface of the film to be etched 302, the protective film 304 formed on the film to be etched 302 can be removed. On the other hand, as shown in FIG. 7, in the region RB, since a film thickness of the protective film 304 formed on the surface of the film to be etched 302 is larger than that of the region RA, the protective film 304 formed on the film to be etched 302 remains.

That is, as shown in FIG. 7, in the region RA where the pattern density of the resist pattern 303 is high, the protectives film 304 containing the boron are selectively formed on the side walls of the resist pattern 303. On the other hand, as shown in FIG. 7, in the region RB where the pattern density of the resist pattern 303 is low, the protective film 304 containing the boron is not only formed on the side wall of the resist pattern 303, and the protective film 304 containing the boron is also formed on an exposed surface (upper surface) of the film to be etched 302. This is because a surface area in the region RA with the low pattern density is relatively smaller than a surface area in the region RB with the high pattern density, and therefore, a film thickness of the protective film 304 per unit surface area in the region RB with the low pattern density is larger than a film thickness of the protective film 304 per unit surface area in the region RA with the high pattern density.

Figure 8:
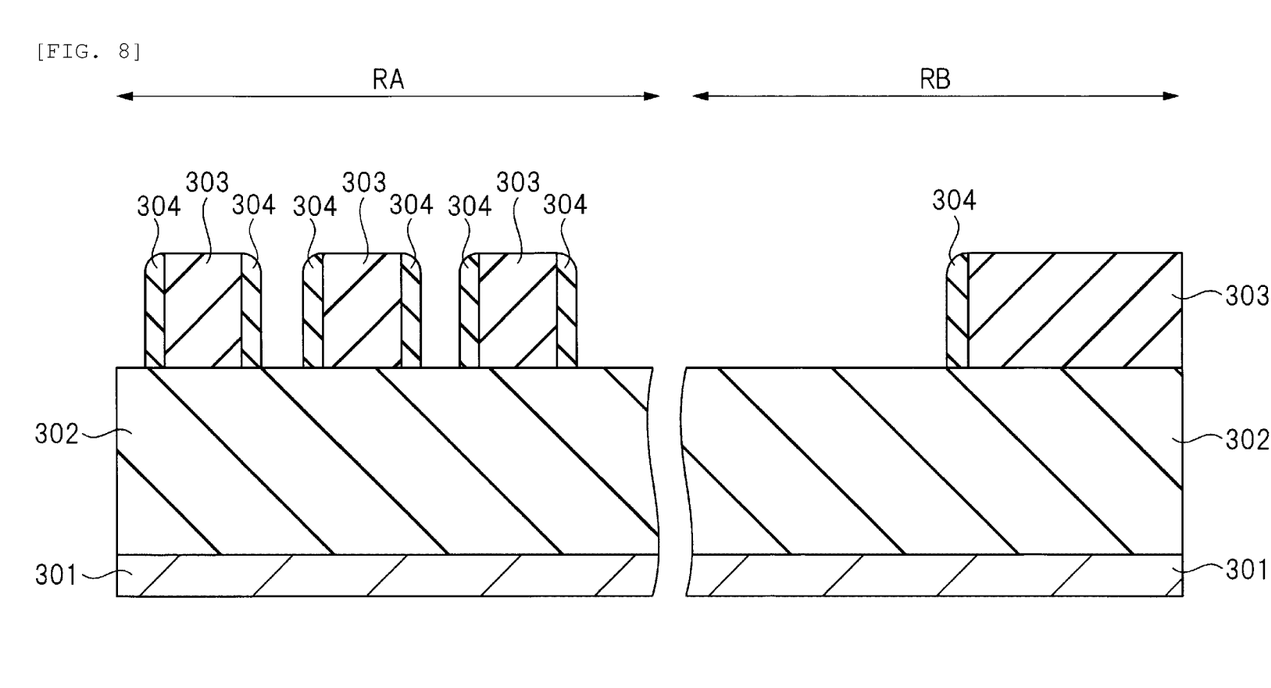
FIG. 8 is a cross-sectional view showing a plasma etching step according to the embodiment.

Subsequently, as shown in FIG. 8, the protective film 304 formed on the film to be etched 302 in the region RB with the low pattern density is removed. This step is the further devised point of the plasma etching step in the present embodiment.

As the further devised point, the following plasma etching step is adopted to remove the protective film 304 formed on the film to be etched 302 in the region RB with the low pattern density. Specifically, the plasma etching is performed under the following processing conditions. For example, as the processing conditions, the microwave power is set to 500 W, the RF bias is applied at 10 W, and a mixed gas including a $CF_4$ gas introduced into the processing chamber at 100 ml/min, a HBr gas introduced into the processing chamber at 50 ml/min, and an Ar gas introduced into the processing chamber at 50 ml/min is used. As the processing condition, a condition in which the temperature of the substrate 201 (wafer) is maintained at 40° C. while an internal pressure of the processing chamber is maintained at 0.5 Pa is used. In this way, as shown in FIG. 8, in the region RB with the low pattern density, the protective film 304 formed on the surface of the film to be etched 302 can be removed.

Here, for example, after performing the step of forming the protective film 304 shown in FIG. 7, if the surface of the substrate 301 is exposed to the atmosphere, the oxygen and the moisture contained in the atmosphere may react with the protective film 304, and the surface of the protective film may be deteriorated. For this reason, it is desirable to perform the step of forming the protective film 304 shown in FIG. 7 and the step of removing the protective film 304 formed on the film to be etched 302 in the region RB with the low pattern density shown in FIG. 8 continuously without opening the processing chamber (chamber).

Figure 9:
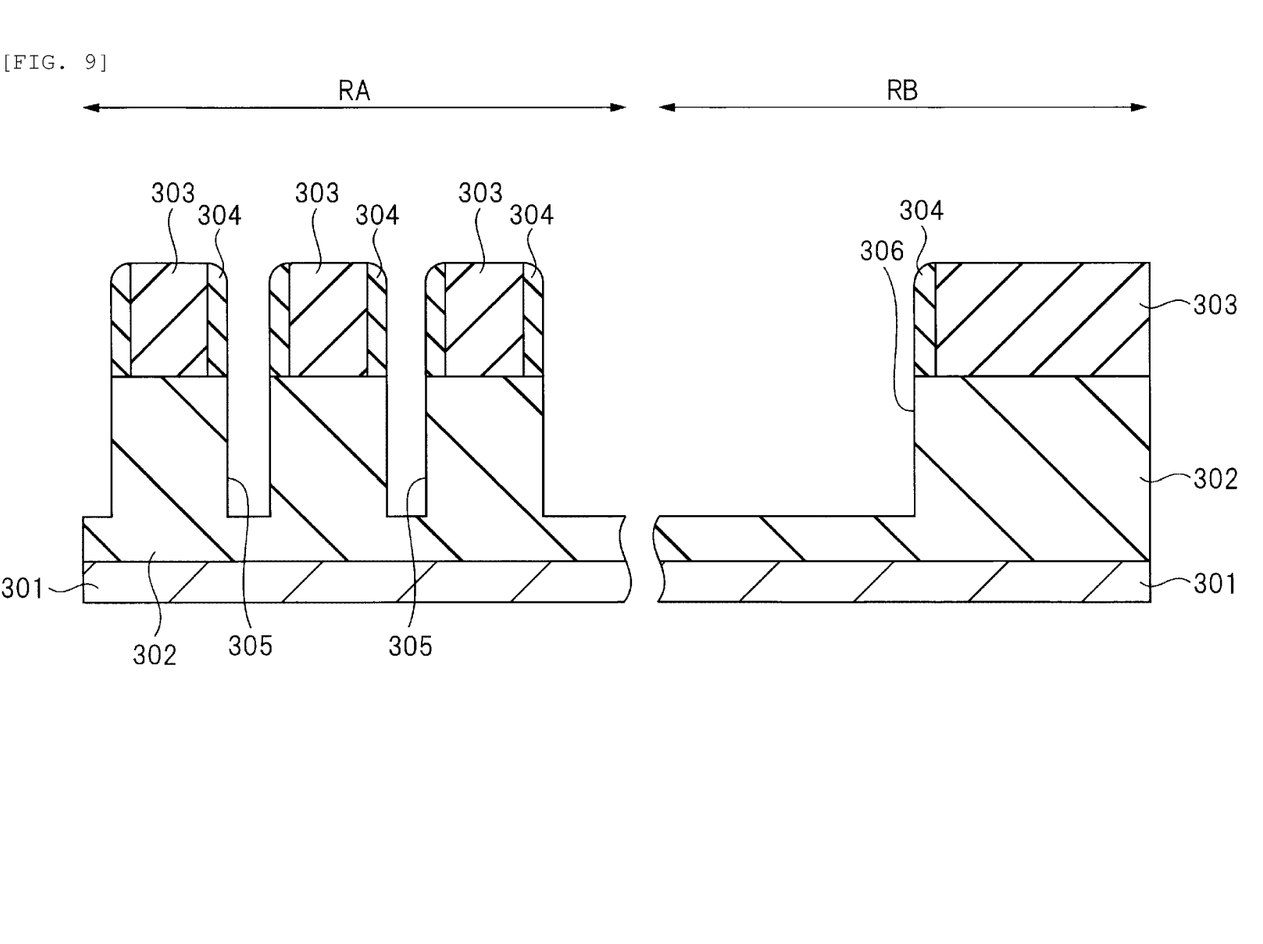
FIG. 9 is a cross-sectional view showing a plasma etching step according to the embodiment.

As described above, the protective film 304 formed on the film to be etched 302 in the region RB with the low pattern density can be removed by adopting the further devised point in the plasma etching step according to the present embodiment. Thereafter, as shown in FIG. 9, in the region RA with the high pattern density, the film to be etched 302 is etched by using the resist pattern 303 and the protective film 304 as the mask in the plasma etching apparatus. As a result, a hole pattern 305 aligning with the protective film 304 can be formed on the film to be etched 302. On the other hand, in the region RB with the low pattern density, since the protective film 304 formed on the surface of the film to be etched 302 is removed, the film to be etched 302 can be etched also by using the resist pattern 303 and the protective film 304 as the mask in the region RB. As a result, a hole pattern 306 aligning with the protective film 304 can be formed on the film to be etched 302 even in the region RB.

The invention made by the present inventor is described above in detail based on the embodiment thereof, but the invention is not limited to the above embodiment, and various changes can be made within the scope not departing from the gist of the invention.

For example, in the above-described embodiment, an example in which the $BCl_3$ gas is used as the gas containing a boron element is described, but the invention is not limited to this, and a $BF_3$ gas, a $BBr_3$ gas, or the like can be used.

Further, in the above-described embodiment, an example in which the $N_2$ gas is used as the gas containing a nitrogen element is described, but the invention is not limited to this, and an $NH_3$ gas, an $NF_3$ gas, or the like can be used.

Further, in the above-described embodiment, an example in which the $CF_4$ gas is used as the gas containing a fluorine element is described, but the invention is not limited to this, and a $CHF_3$ gas, a $CH_2F_2$ gas, a $CH_3F$ gas, a $C_4F_8$ gas or the like can be used.

REFERENCE SIGN LIST

100: Plasma etching apparatus
101: Chamber
102: Substrate to be processed
103: Stage
104: Shower plate
105: Dielectric window
106: Processing chamber
107: Gas supply device
108: Waveguide
109: Electromagnetic wave generation power supply
110: Magnetic field generation coil
111: Plasma
112: DC power supply
113: Radio frequency power supply
201: Substrate
202: Film to be etched
203: Resist pattern
204: Protective film
205: Hole pattern
301: Substrate
302: Film to be etched
303: Resist pattern
304: Protective film
305: Hole pattern
306: Hole pattern

The invention claimed is:

1. A plasma processing method in which plasma etching is performed on a film to be etched by using a mask, the plasma processing method comprising:
a deposition step of depositing a deposition film containing a boron element on sidewalls of the mask while a radio frequency power is supplied to a sample table on which a sample formed with the film to be etched is placed, wherein the mask includes a first region with a first pattern density and a second region with a second pattern density that is lower than the first pattern density;
a removing step of removing the deposition film formed on the film to be etched of the second region by using a first plasma after the deposition step such that the deposition film is left on the sidewalls of the mask of the second region; and
an etching step of etching the film to be etched by using a second plasma after the removing step,
wherein, in said deposition step, the deposition film containing the boron element is selectively formed on the sidewalls of the mask of the first region, and the deposition film containing the boron element is formed on the sidewalls and on a surface of the film to be etched of the second region.

2. The plasma processing method according to claim 1, wherein:
the first plasma in the removing step is generated by using a mixed gas including a hydrogen bromide gas and a fluorine-containing gas.

3. The plasma processing method according to claim 2, wherein:
the fluorine element-containing gas is a $CF_4$ gas.

4. The plasma processing method according to claim 1, wherein:
the deposition step is performed by a third plasma which is generated by using a mixed gas including a boron element-containing gas and a nitrogen element-containing gas.

5. The plasma processing method according to claim 4, wherein:
the boron element-containing gas is a boron trichloride gas, and the nitrogen element-containing gas is a nitrogen gas.

6. The plasma processing method according to claim 1, wherein:
the deposition step is performed by a third plasma which is generated by using a mixed gas including a $BCl_3$ gas, a $N_2$ gas, a $CF_4$ gas, and an Ar gas.

7. The plasma processing method according to claim 1, wherein:
the first plasma used in the removing step is generated by using a mixed gas including a $CF_4$ gas, a HBr gas, and an Ar gas.

8. The plasma processing method according to claim 1, wherein
the film to be etched is a polysilicon film, a silicon oxide film, or a silicon nitride film.

9. The plasma processing method according to claim 1, wherein
the deposition step is performed while maintaining a temperature of a substrate of the sample between 10° C. and 100° C.

* * * * *